United States Patent
Tanaka et al.

(10) Patent No.: US 7,323,255 B2
(45) Date of Patent: Jan. 29, 2008

(54) METHOD OF PRODUCING BASE PLATE CIRCUIT BOARD, BASE PLATE FOR CIRCUIT BOARD, AND CIRCUIT BOARD USING THE BASE PLATE

(75) Inventors: Katsufumi Tanaka, Aichi-ken (JP); Kyoichi Kinoshita, Aichi-ken (JP); Tomohei Sugiyama, Aichi-ken (JP); Eiji Kono, Aichi-ken (JP)

(73) Assignee: Kabushiki Kaisha Toyota Jidoshokki, Kariya-shi (JP)

( * ) Notice: Subject to any disclaimer, the term of this patent is extended or adjusted under 35 U.S.C. 154(b) by 57 days.

(21) Appl. No.: 11/185,633

(22) Filed: Jul. 19, 2005

(65) Prior Publication Data

US 2006/0046035 A1    Mar. 2, 2006

(30) Foreign Application Priority Data

Sep. 1, 2004    (JP) .............................. 2004-254766
Mar. 16, 2005   (JP) .............................. 2005-075514

(51) Int. Cl.
- *B32B 15/00* (2006.01)
- *H01L 23/06* (2006.01)
- *H05K 1/00* (2006.01)
- *H05K 7/20* (2006.01)

(52) U.S. Cl. ...................... 428/615; 428/627; 257/703; 257/706; 257/713; 257/717; 174/252; 361/706; 361/709; 361/711; 361/719

(58) Field of Classification Search ........ 428/209–210, 428/615, 627; 257/703, 706, 713; 361/706, 361/709, 711, 719; 174/252
See application file for complete search history.

(56) References Cited

U.S. PATENT DOCUMENTS

| | | | |
|---|---|---|---|
| 5,608,267 A * | 3/1997 | Mahulikar et al. | 257/796 |
| 6,033,787 A * | 3/2000 | Nagase et al. | 428/545 |
| 6,280,496 B1 * | 8/2001 | Kawai et al. | 75/236 |
| 6,284,389 B1 * | 9/2001 | Jones et al. | 428/614 |
| 6,309,737 B1 * | 10/2001 | Hirashima et al. | 428/210 |
| 6,388,273 B1 * | 5/2002 | Yamagata et al. | 257/77 |
| 6,462,410 B1 * | 10/2002 | Novotny et al. | 257/707 |
| 6,534,190 B1 * | 3/2003 | Yamagata et al. | 428/472 |
| 6,884,522 B2 * | 4/2005 | Adams et al. | 428/614 |
| 6,974,558 B2 * | 12/2005 | Yamagata et al. | 419/17 |
| 7,038,313 B2 * | 5/2006 | Mochizuki et al. | 257/713 |
| 7,128,979 B2 * | 10/2006 | Nagase et al. | 428/545 |
| 7,141,310 B2 * | 11/2006 | Adams et al. | 428/614 |

FOREIGN PATENT DOCUMENTS

| | | | |
|---|---|---|---|
| JP | 06-310825 | | 11/1994 |
| JP | 08-335652 | * | 12/1996 |
| JP | 2001-053199 | * | 2/2001 |

\* cited by examiner

*Primary Examiner*—Cathy F. Lam
(74) *Attorney, Agent, or Firm*—Morgan & Finnegan, L.L.P.

(57) ABSTRACT

First, a melt of Al or a melt of an Al alloy containing Si is injected in a die filled with SiC powder and cast to form a plate member made of an Al/SiC composite. Next, an Al foil member made of an Al—Mg-based alloy is joined with the surface of the plate member through hot pressing. As a result, part of the Al foil member enters casting blowholes on the surface of the plate member to fill the casting blowholes. In addition, an Al—Mg-based alloy layer is formed on the surface of the plate member. Thus, a base plate having a nearly flat surface is produced.

6 Claims, 8 Drawing Sheets

METHOD OF PRODUCING BASE PLATE CIRCUIT BOARD, BASE PLATE FOR CIRCUIT BOARD, AND CIRCUIT BOARD USING THE BASE PLATE

BACKGROUND OF THE INVENTION

1. Field of the Invention

The present invention relates to a method of producing a base plate for a circuit board. In particular, the present invention relates to a method of producing a base plate which has an insulating layer formed on its surface and is used for a circuit board of a semiconductor device or the like.

The present invention also relates to a base plate for a circuit board and a circuit board using the base plate.

2. Description of the Related Art

Known examples of a method of forming a circuit board involving the formation of an insulating layer on the surface of a base plate include a method as shown in JP 06-310825 A involving the steps of applying an insulating material made of a resin or the like to the surface of a base plate and curing the applied insulating material. A circuit board formed as described above is used as a semiconductor device by joining through a solder a semiconductor element on a wiring layer formed on the surface of the insulating layer.

A base plate formed of Al or the like having a high coefficient of thermal conductivity has been generally used in a semiconductor device for the purpose of efficiently dissipating heat generated in a semiconductor element to the outside. However, there is a large difference in coefficient of thermal expansion between a semiconductor material such as Si used for the semiconductor element and Al forming the base plate. As a result, a thermal stress is generated between the base plate and the semiconductor element upon a change in temperature. Therefore, the semiconductor element may warp, or a crack may develop in solder for joining the semiconductor element.

In view of the above, the use of a base plate formed of an Al/SiC composite having an excellent coefficient of thermal conductivity but having a small coefficient of thermal expansion has been recently proposed to alleviate a thermal stress in a semiconductor device.

A base plate formed of such Al/SiC composite is produced by casting, but casting blowholes are known to occur on the surface of the base plate or in the base plate at the time of casting. Therefore, when an insulating layer is formed on the surface of the base plate by means of the above-described method such as application, the insulating layer is affected by the casting blowholes on the surface of the base plate. As a result, the insulating layer includes some portions having a thickness smaller than a predetermined thickness, so desired insulating property may not be secured.

In contrast, the desired insulating property can be secured by sealing casting blowholes on the surface of a base plate by means of surface grinding, impregnation with a resin, or the like and thereafter forming an insulating layer on the surface of the base plate. In the case of surface grinding, however, the cost for grinding results in an increase in total cost, and the size of the base plate cannot be increased by reason of equipment. In the case of impregnation with a resin, the casting blowholes is sealed with a resin having a lower coefficient of thermal conductivity and a larger coefficient of thermal expansion than those of a metal. As a result, the base plate will have a reduced coefficient of thermal conductivity and an increased coefficient of thermal expansion, thereby reducing thermal property values of the entire base plate.

Also, there is a method of joining a heat sink with a base plate to efficiently dissipate generated heat. The base plate and the heat sink may be joined with each other by means of silicone grease. However, the coefficient of thermal conductivity of the silicone grease is generally as low as 0.8 W/mK, thereby resulting in an increase in thermal resistance due to the grease.

SUMMARY OF THE INVENTION

The present invention has been made with a view to solving the above problems, and an object of the present invention is to provide a method of producing a base plate for a circuit board formed of an Al/SiC composite which can easily seal casting blowholes on the surface of the base plate at low cost without reductions in thermal property values.

Another object of the present invention is to provide a method of producing a base plate for a circuit board in which an Al/SiC composite and a heat sink are joined with each other while an increase in thermal resistance is suppressed.

Still another object of the present invention is to provide a base plate for a circuit board produced by means of such production method and a circuit board using the base plate.

According to one aspect of the present invention, there is provided a method of producing a base plate for a circuit board including the steps of casting a plate member made of an Al/SiC composite and joining through heating an Al foil member with the front surface of the cast plate member.

According to another aspect of the present invention, there is provided a base plate for a circuit board including a plate member made of an Al/SiC composite formed by casting and an alloy layer formed on the front surface of the plate member and made of one of an Al—Mg-based alloy, an Al—Li-based alloy, and an Al—Ti-based alloy.

According to another aspect of the present invention, there is provided a circuit board including a base plate formed by means of the above method, an insulating layer formed on the surface of an alloy layer of the base plate and a wiring layer formed on the surface of the insulating layer.

DESCRIPTION OF THE PREFERRED EMBODIMENTS

Hereinafter, embodiments of the present invention will be described with reference to the accompanying drawings.

Embodiment 1

Figure 1:
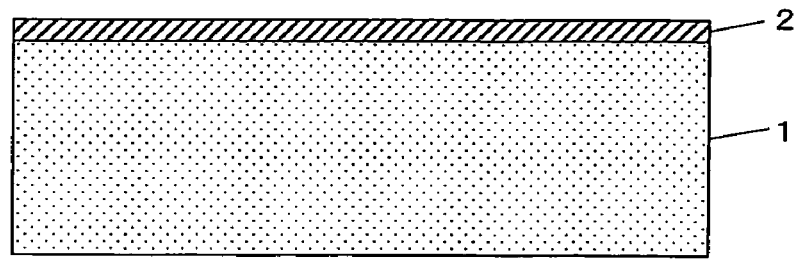
FIG. 1 is a sectional view showing a base plate for a circuit board according to Embodiment 1 of the present invention.

FIG. 1 shows a sectional view of a base plate for a circuit board according to Embodiment 1 of the present invention. The base plate includes a plate member 1 made of an Al/SiC composite and an Al—Mg-based alloy layer 2 formed on the surface of the plate member 1. The Al/SiC composite forming the plate member 1 and the Al—Mg-based alloy layer 2 have melting points different from each other.

Figure 2:
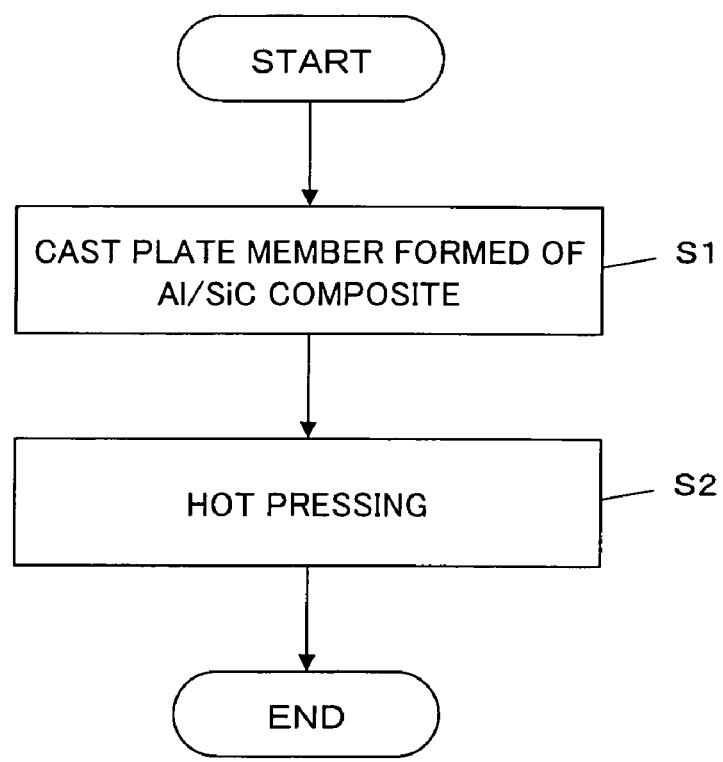
FIG. 2 is a flow chart showing a method of producing the base plate for a circuit board according to Embodiment 1.

Next, a method of producing the base plate for a circuit board according to Embodiment 1 of the present invention will be described with reference to the flow chart shown in FIG. 2. First, in Step S1, a melt of Al or a melt of an Al alloy containing Si is injected into a die filled with SiC powder and then cast to form the plate member 1 made of an Al/SiC composite as shown in FIG. 3.

Here, the SiC powder was filled in the die, and a melt of an Al alloy having an Si content of 11 wt % (AC3A: melting point 580° C.) was cast under reduced pressure in the die to form the plate member 1 made of an Al/SiC composite. At this time, the plate member 1 had a surface roughness Rmax of about 160 µm.

Figure 3:
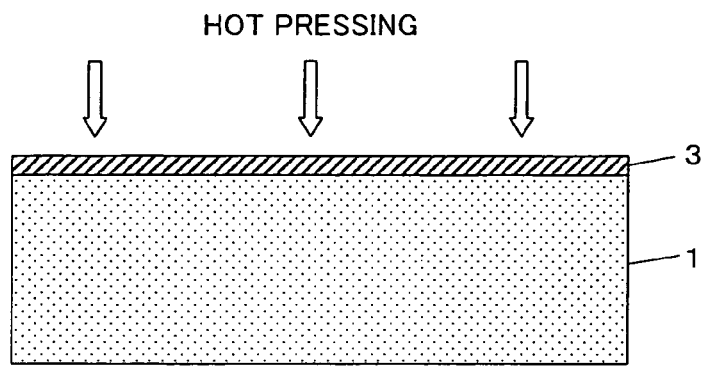
FIG. 3 is a sectional view showing how an Al foil member is joined with a plate member in Embodiment 1.
Figure 4:
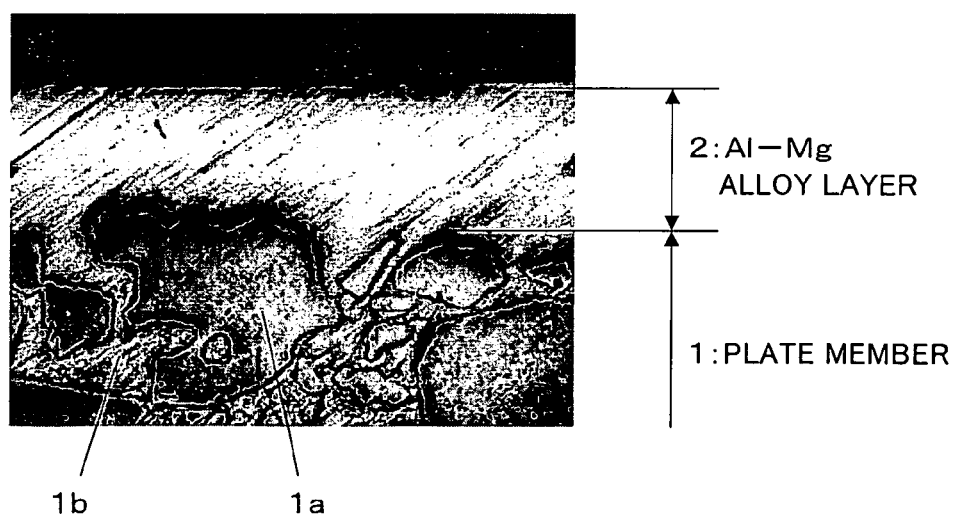
FIG. 4 is a micrograph showing the structure near an Al—Mg-based alloy layer in Embodiment 1.

Next, in Step S2, as shown in FIG. 3, an Al foil member 3 having a thickness of 700 µm formed of an Al alloy containing Mg, that is, an Al—Mg-based alloy is joined with the surface of the plate member 1 through hot pressing. As a result, as shown in FIG. 4, part of the Al foil member 3 enters casting blowholes 1b, which are formed in SiC powder 1a of the plate member 1 and has a size of, for example, about 100 to 200 µm, from the surface of the plate member 1 to fill the casting blowholes 1b. In addition, the Al—Mg-based alloy layer 2 is formed on the surface of the plate member 1. Thus, a base plate having a nearly flat surface is produced. At this time, it was possible to suppress the surface roughness Rmax of the base plate to about 2 to 33 µm.

For example, an Al—Mg-based alloy containing 2 to 3% of Mg and having a melting point of about 600° C. (A5052) is used for the Al foil member 3. The Al foil member 3 is joined with the surface of the plate member 1 at a junction temperature of 540° C. (set temperature of a furnace 580° C., sample end temperature 540° C.) and a pressure of 9.2 MPa, for example. Here, Mg has a stronger affinity for oxygen than that of Al, and has a reducing effect on an oxide film of Al during diffusion joining. As a result, an amorphous oxide film at a joining interface is transformed into crystal oxide particles to result in a remarkable increase in joining strength. That is, Mg in the Al foil member 3 increases the joining property of the Al foil member 3 with the surface of the plate member 1, so the Al foil member 3 and the plate member 1 can be surely joined with each other.

The base plate thus formed has a nearly flat and casting blowhole-free surface owing to the Al—Mg-based alloy layer 2 formed on the surface of the plate member 1. Therefore, an insulating layer having a predetermined thickness can be formed on the surface of the base plate without being affected by the surface roughness of the base plate. As a result, desired insulating property can be secured.

In addition, in the present invention, the casting blowholes 1b on the surface of the plate member 1 is sealed by joining through heating the Al foil member 3 with the surface of the plate member 1. Accordingly, casting blowholes of even a large base plate can be sealed easily as compared to the conventional treatment by using a surface grinding. Therefore, mass production and cost reduction can be achieved.

Since the Al foil member 3 is made of a metal, the casting blowholes can be sealed without reductions in thermal property values of the base plate as compared to the conventional treatment by using an impregnation with a resin. For example, when the Al foil member 3 having a thickness of 400 µm is joined with the surface of the plate member 1 having a coefficient of thermal conductivity of about 233 W/mK to produce a base plate, the base plate has a coefficient of thermal conductivity of about 220 W/mK. In other words, casting blowholes can be sealed while an excellent coefficient of thermal conductivity is maintained.

The presence of SiC on the surface of the base plate makes it difficult to perform a surface-roughening treatment for improving adhesiveness with the insulating layer. However, the base plate of Embodiment 1 has the Al—Mg-based alloy layer 2 on its surface. Therefore, the base plate can be subjected to a surface-roughening treatment such as an alumite treatment in the same manner as in a conventional base plate formed of Al. Here, the base plate preferably has a surface roughness of 10 µm or more for the purpose of improving adhesiveness between the base plate and the insulating layer. Therefore, when the produced base plate has a surface roughness of less than 10 µm, the surface of the base plate is subjected to an alumite treatment to increase the surface roughness Rmax to 10 µm or more, to thereby improve the adhesiveness between the base plate and the insulating layer.

The surface of the base plate may be subjected to a surface-roughening treatment by means of etching, shot blasting, or the like instead of the alumite treatment.

Figure 5:
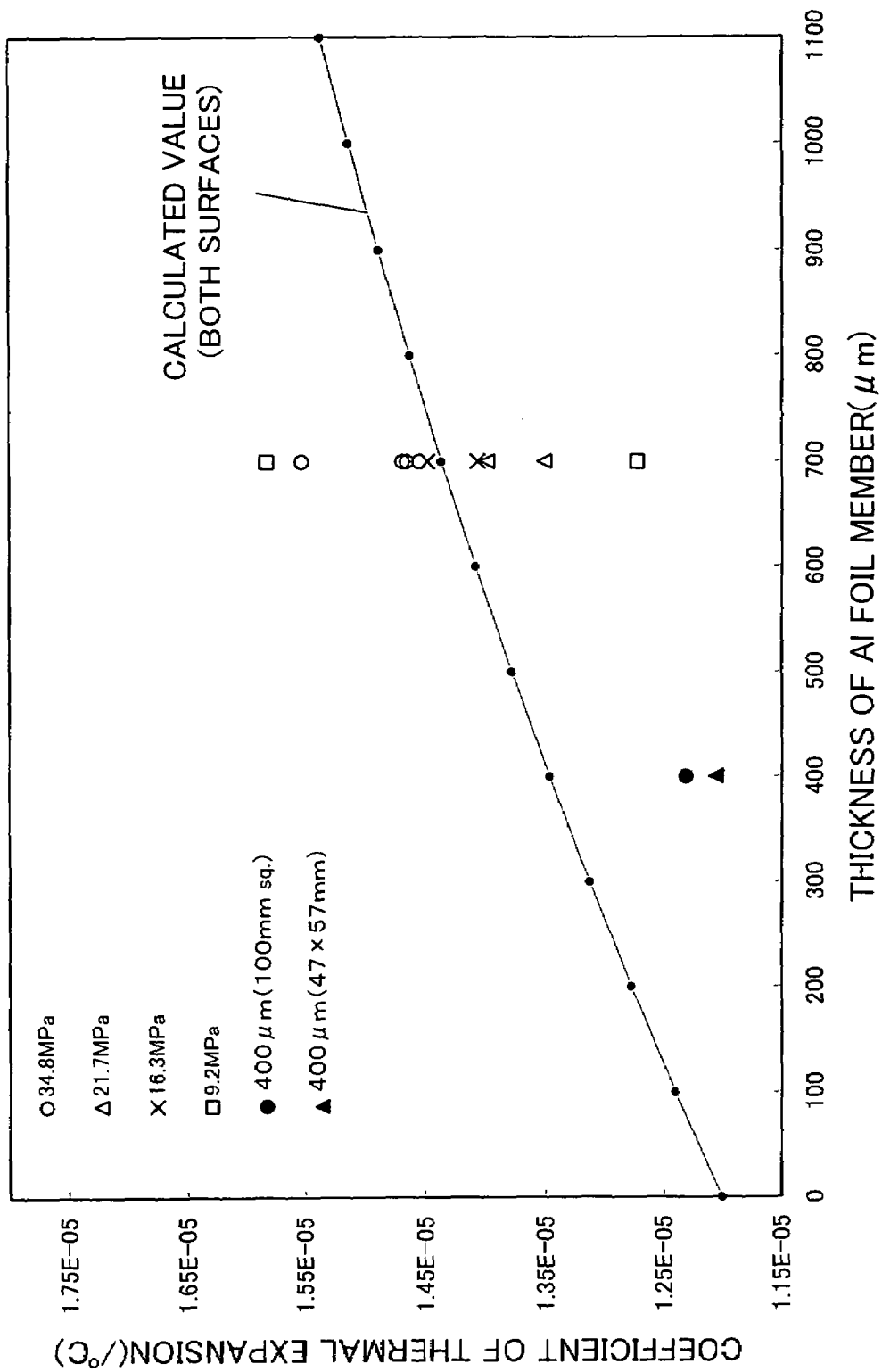
FIG. 5 is a graph showing a relation of the coefficient of thermal expansion of the surface of the base plate to the thickness of the Al foil member.

FIG. 5 shows a change in the coefficient of thermal expansion of the surface of a base plate produced by forming the plate member 1 from, for example, an Al/SiC composite having a coefficient of thermal expansion of $1.2 \times 10^{-5}/°$ C.

and then joining through heating the Al foil member 3 with a varying thickness to the plate member 1. As can be seen from FIG. 5, the smaller the thickness of the Al foil member 3 to be joined, the lower the coefficient of thermal expansion of the surface of the base plate. Calculated values indicated by a solid line in FIG. 5 each show the coefficient of thermal expansion of the surface of the base plate, which is produced by joining through heating the Al foil member 3 having a coefficient of thermal expansion of $2.5 \times 10^{-5}/°$ C. with both surfaces of the plate member 1 made of the Al/SiC composite having a coefficient of thermal expansion of $1.2 \times 10^{-5}/°$ C., when the thickness of the Al foil member 3 to be joined is changed.

Similarly, as can be seen from FIG. 5, when the Al foil member 3 having a constant thickness of, for example, 400 μm is joined with the surface of the plate member 1, the coefficient of thermal expansion of the surface of the base plate also varies depending on the size of the Al foil member 3.

As can be seen from FIG. 5, when the Al foil member 3 having a constant thickness of, for example, 700 μm is joined with the surface of the plate member 1, the coefficient of thermal expansion of the surface of the base plate varies depending on a change in pressure at the time of joining.

That is, the coefficient of thermal expansion of the surface of the base plate can be set to a desired value by selecting, for example, the thickness and size of the Al foil member 3 to be joined, and a pressure at the time of joining.

Embodiment 2

Figure 6:
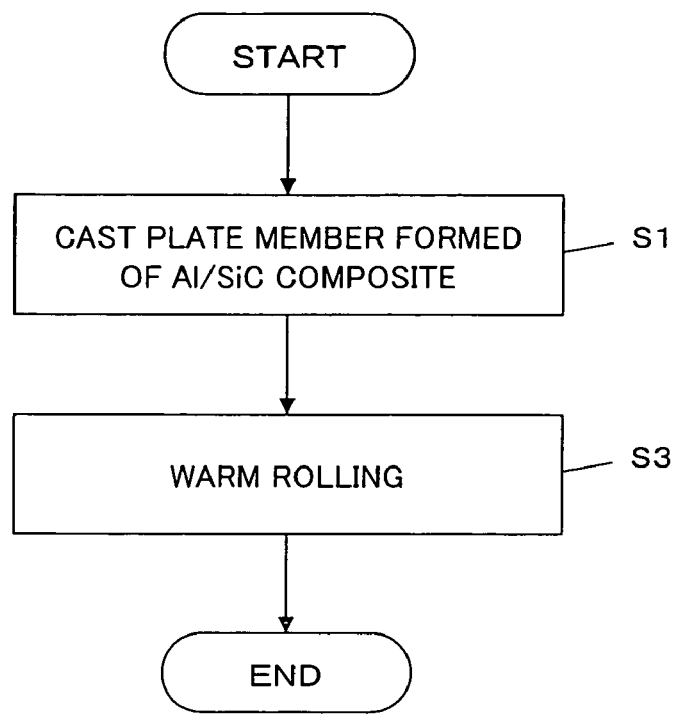
FIG. 6 is a flow chart showing a method of producing a base plate for a circuit board according to Embodiment 2 of the present invention.

A method of producing a base plate for a circuit board according to Embodiment 2 of the present invention will be described with reference to FIG. 6. The production method according to Embodiment 2 is different from the production method according to Embodiment 1 in that an Al foil member 3 is joined with the surface of the plate member 1 through warm rolling instead of hot pressing.

Figure 7:
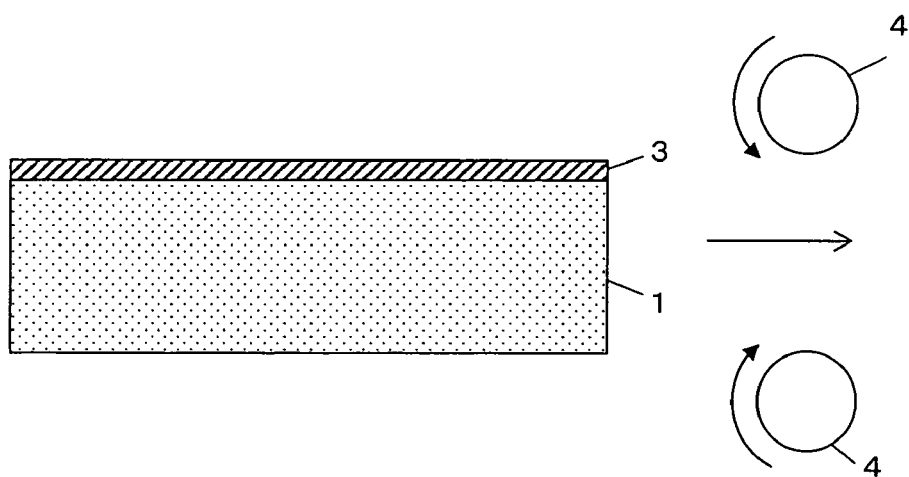
FIG. 7 is a sectional view showing how an Al foil member is joined with a plate member in Embodiment 2.

That is, in Step S1, the plate member 1 made of an Al/SiC composite is formed by casting in the same manner as in Embodiment 1. Next, in Step S3, as shown in FIG. 7, the Al foil member 3 made of an Al—Mg-based alloy is joined with the surface of the plate member 1 through warm rolling by means of rolls 4. Each of the plate member 1 to be formed in Step S1 and the Al foil member 3 to be joined with the surface of the plate member 1 in Step S3 is the same as that in Embodiment 1 described above. During warm rolling, the Al foil member 3 is joined with the surface of the plate member 1 at a junction temperature of, for example, 580° C.

In this way as well, as shown in FIG. 4, part of the Al foil member 3 enters casting blowholes 1b, which are formed in SiC powder 1a of the plate member 1, from the surface of the plate member 1 to fill the casting blowholes 1b. In addition, an Al—Mg-based alloy layer 2 is formed on the surface of the plate member 1. Thus, a base plate having a nearly flat and casting blowhole-free surface is produced.

Therefore, as in the case of Embodiment 1, the casting blowholes on the surface of the plate member 1 can be easily sealed at low cost without reductions in thermal property values. In addition, an insulating layer having a predetermined thickness can be formed on the surface of the base plate without being affected by the surface roughness of the base plate. As a result, desired insulating property can be secured.

The base plate of Embodiment 2 can also be subjected to a surface-roughening treatment such as an alumite treatment as in the case of Embodiment 1 because it has the Al—Mg-based alloy layer 2 on its surface.

In Embodiment 2, the plate member 1 and the Al foil member 3 were joined with each other through warm rolling. They may be joined with each other through cold rolling.

In each of Embodiments 1 and 2 described above, the temperature at which the Al foil member 3 is joined with the surface of the plate member 1 through hot pressing or warm rolling is set to 580° C. However, the present invention is not limited to such temperature. It is preferable to set the temperature to a temperature near and equal to or lower than the melting point of the Al/SiC composite forming the plate member 1, that is, the melting point of Al or the Al alloy containing Si to be injected in the die at the time of casting of the plate member 1, for example, about 550 to 580° C. In each of Embodiments 1 and 2 described above, the junction temperature is preferably set to approximately the melting point (580° C.) of the Al alloy having an Si content of 11 wt % (AC3A).

In each of Embodiments 1 and 2, the melting point of the Al foil member 3 is 600° C. and the melting point of the plate member 1 is 580° C. That is, the Al foil member 3 has a higher melting point than that of the plate member 1. In contrast, when the Al—Mg-based alloy of the Al foil member 3 has a lower melting point than that of the Al/SiC composite of the plate member 1, the temperature at which the Al foil member 3 is joined with the plate member 1 is preferably set to a temperature near the melting point of the Al—Mg-based alloy forming the Al foil member 3.

The Al foil member 3 is formed of an Al—Mg-based alloy containing about 2 to 3% of Mg. However, the present invention is not limited thereto. The Al foil member 3 may be formed of an Al—Mg-based alloy containing 2% or less of Mg, or may be formed of an Al—Mg-based alloy containing 3% or more of Mg.

The Al foil member 3 may also be formed of an alloy containing not only Mg but also another substance such as Si.

The Al foil member 3 may be formed of an Al—Li-based alloy added with Li instead of an Al—Mg-based alloy. Since Li has a stronger affinity for oxygen than that of Al as in the case of Mg, Li in the Al foil member 3 can increase the joining property of the Al foil member 3 with the surface of the plate member 1. When the Al foil member 3 formed of an Al—Li-based alloy is used as described above, an Al—Li-based alloy layer is formed on the surface of the plate member 1. Here, the Al/SiC composite forming the plate member 1 and the Al—Li-based alloy layer have melting points different from each other.

The Al foil member 3 may also be formed of an Al—Ti-based alloy added with Ti. In this case, an Al—Ti-based alloy layer is formed on the surface of the plate member 1.

The Al foil member 3 has a thickness upper limit of preferably 1 mm or less, that is, 1,000 μm or less, or more preferably 700 μm or less. Meanwhile, the member has a thickness lower limit of preferably 200 μm or more.

In each of Embodiments 1 and 2 described above, the SiC powder was filled in the die, and a melt of the Al alloy having an Si content of 11 wt % (AC3A) was cast under reduced pressure in the die to form the plate member made of an Al/SiC composite. However, the present invention is not limited thereto. It is preferable to form a plate member made of an Al/SiC composite having a small coefficient of thermal expansion and an excellent coefficient of thermal conductivity by selecting, for example, the Si content of the melt, that is, the kind of the melt, and by selecting the temperature of the melt, and the particle size of the SiC powder.

Casting may be performed by means of any one of various methods such as die casting, die casting in oxygen (PF method), and high pressure casting instead of casting under reduced pressure described above.

As shown in FIG. 1, the base plate for a circuit board formed by means of the method shown in each of Embodiments 1 and 2 described above has a nearly flat and casting blowhole-free surface owing to the Al—Mg-based alloy layer 2, or the Al—Li-based or Al—Ti-based alloy layer formed on the surface of the plate member 1.

Figure 8:
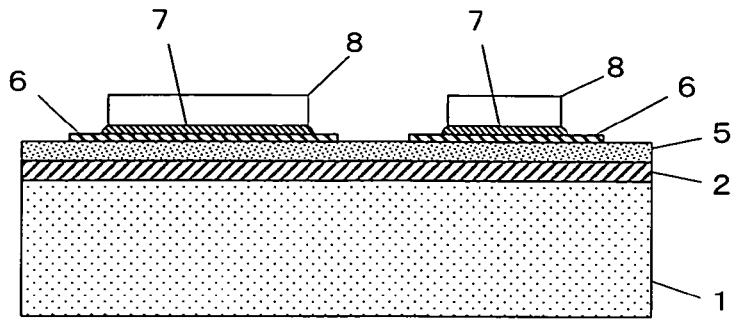
FIG. 8 is a sectional view showing a semiconductor device using the base plate for a circuit board according to each of Embodiments 1 and 2 of the present invention.

As shown in FIG. 8, an insulating layer 5 having a thickness of, for example, 100 μm is formed on the surface of the Al—Mg-based alloy layer 2, or the Al—Li-based or Al—Ti-based alloy layer, of the base plate. In addition, a wiring layer 6 made of Cu or the like is formed on the surface of the insulating layer 5, whereby a circuit board can be formed. Furthermore, a semiconductor element 8 is joined onto the wiring layer 6 via solder 7. The resultant can be used as a semiconductor device. The insulating layer 5 is preferably formed to have a thickness corresponding to the requisite electric resistance of the semiconductor device.

Embodiment 3

Figure 9:
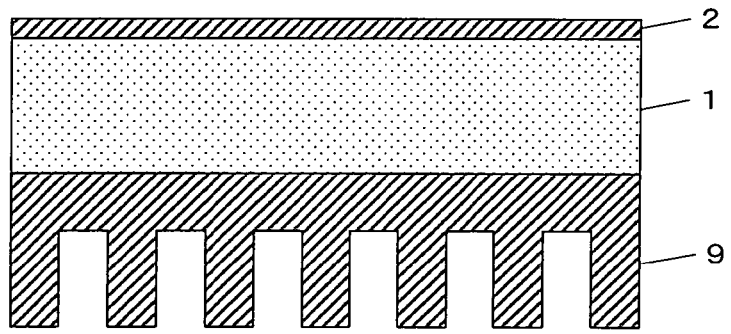
FIG. 9 is a sectional view showing a base plate for a circuit board according to Embodiment 3 of the present invention.

FIG. 9 shows a sectional view of a base plate for a circuit board according to Embodiment 3. The base plate is obtained by joining an Al heat sink 9 with the rear surface of the plate member 1 in the base plate of Embodiment 1 shown in FIG. 1. The Al heat sink 9 is formed of one of an Al—Mg-based alloy, an Al—Li-based alloy, and an Al—Ti-based alloy as in the case of the Al foil member 3.

Figure 10:
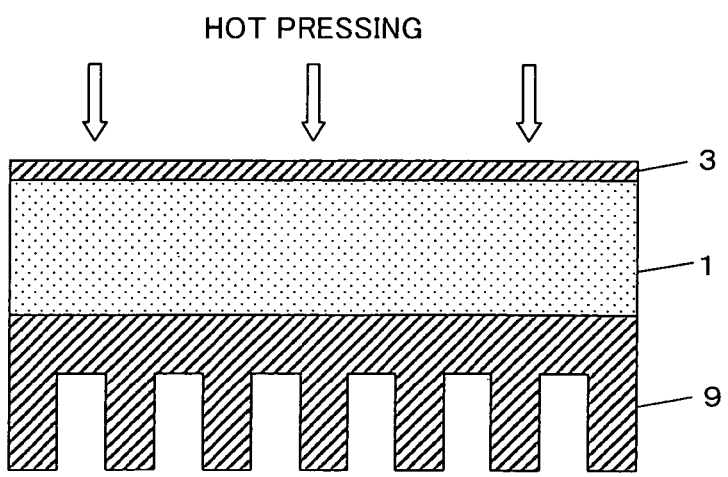
FIG. 10 is a sectional view showing how an Al foil member and an Al heat sink are joined with a plate member in Embodiment 3.

Such base plate can be produced by casting a plate member 1 made of an Al/SiC composite and then bringing an Al foil member 3 formed of, for example, an Al—Mg-based alloy and the Al heat sink 9 formed of an Al—Mg-based alloy in the same manner as in the Al foil member 3 into contact with the surface and rear surface of the plate member 1, respectively, as shown in FIG. 10 and simultaneously joining through hot pressing the Al foil member 3 and the Al heat sink 9 with the surface and rear surface of the plate member 1, respectively, in this state. At this time, as shown in FIG. 4, on the surface of the plate member 1, part of the Al foil member 3 enters casting blowholes 1b, which are formed in SiC powder 1a of the plate member 1, to fill the casting blowhole 1b. In addition, an Al—Mg-based alloy layer 2 is formed on the surface of the plate member 1. At the same time, on the rear surface of the plate member 1 as well, part of the Al heat sink 9 enters the casting blowholes 1b of the plate member 1 to fill the casting blowholes 1b. In addition, an Al—Mg-based alloy layer is formed at the interface between the plate member 1 and the Al heat sink 9. Mg in the Al heat sink 9 allows the Al heat sink 9 to be strongly joined with the rear surface of the plate member 1.

That is, the Al foil member 3 and the Al heat sink 9 can be simultaneously joined with the surface and rear surface of the plate member, respectively, through one step of hot pressing. If the Al foil member 3 and the Al heat sink 9 are formed of Al—Mg-based alloys having the same composition, they can be joined at the common junction temperature because they have the same melting point.

The Al heat sink 9 is formed in advance into a shape of a heat sink having a fin or the like.

In actuality, the Al foil member 3 and the Al heat sink 9 each made of an Al—Mg-based alloy having a melting point of about 600° C. (A5052) were brought into contact with the surface and rear surface of the plate member 1, respectively, and were joined with the surfaces through hot pressing at a junction temperature of 540° C. (set temperature of a furnace 580° C., sample end temperature 540° C.) and a pressure of 9.2 MPa. As a result, both the Al foil member 3 and the Al heat sink 9 were found to be satisfactorily joined with the plate member 1 made of an Al/SiC composite.

Although the Al foil member 3 and the Al heat sink 9 may have different compositions, both the Al foil member 3 and the Al heat sink 9 are desirably joined simultaneously at such junction temperature that may not damage the fin shape of the Al heat sink 9.

Figure 11:
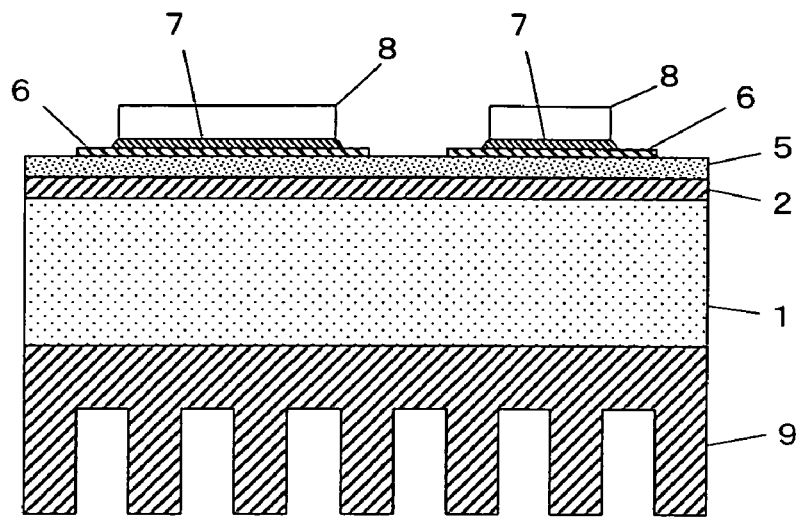
FIG. 11 is a sectional view showing a semiconductor device using the base plate for a circuit board according to Embodiment 3.

As shown in FIG. 11, an insulating layer 5 is formed on the surface of the Al—Mg-based alloy layer 2 of the base plate equipped with the heat sink thus produced. In addition, a wiring layer 6 made of Cu or the like is formed on the surface of the insulating layer 5, whereby a circuit board can be formed. Furthermore, a semiconductor element 8 is joined onto the wiring layer 6 via solder 7. Thus, a semiconductor device can be constituted.

Figure 12:
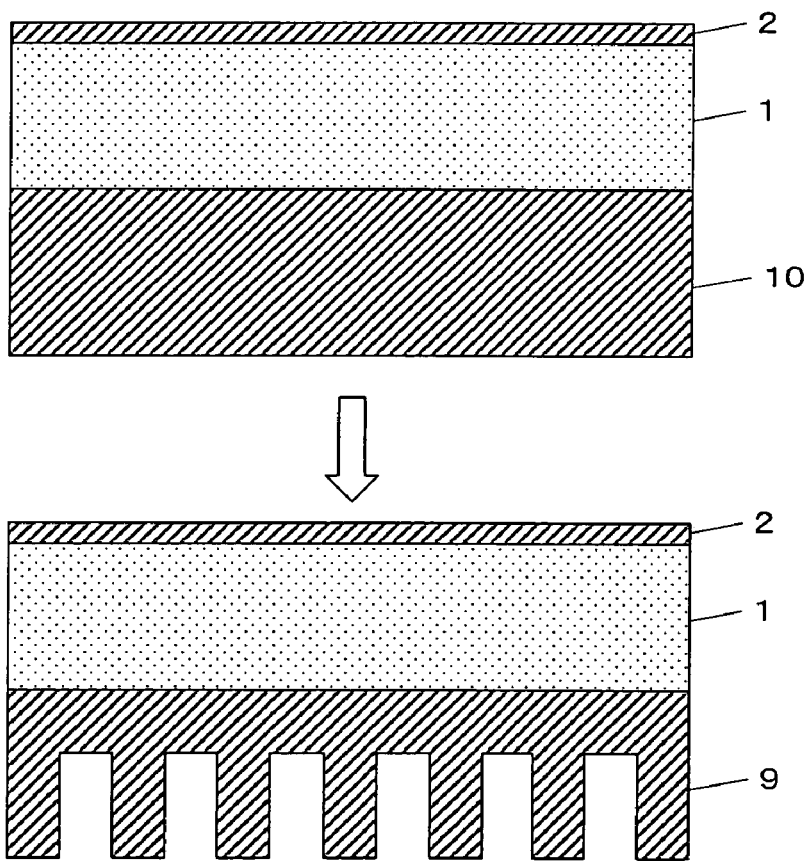
FIG. 12 is a sectional view showing a method of producing a base plate in a modified example of Embodiment 3.

The following procedure may also be adopted. First, as shown in FIG. 12, a plate-like Al heat sink member 10 not processed into a shape of a heat sink is joined with the rear surface of the plate member 1. Then, the Al heat sink member 10 is processed into a shape of a heat sink to form the Al heat sink 9. That is, the Al heat sink 9 can also be formed by joining the Al foil member 3 with the surface of the plate member 1 made of an Al/SiC composite to form the Al—Mg-based alloy layer 2 and, at the same time, joining, with the rear surface of the plate member 1, the Al heat sink member 10 formed of one of an Al—Mg-based alloy, an Al—Li-based alloy, and an Al—Ti-based alloy and not processed into a shape of a heat sink and then processing the Al heat sink member 10 into a shape of a heat sink such as a fin.

When a base plate is produced in the manner as described above, the fin shape is not damaged even if a junction temperature is set to a high temperature because no fin shape is present at the time of joining.

Embodiment 4

Figure 13:
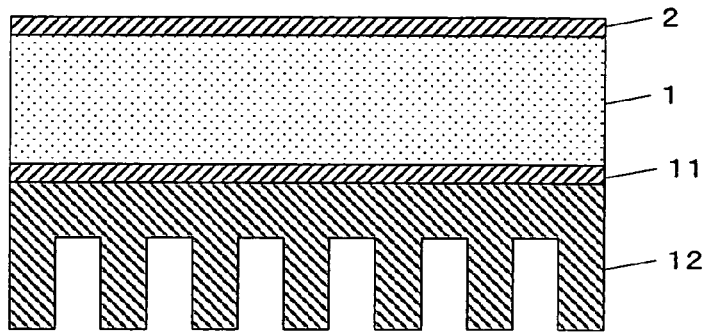
FIG. 13 is a sectional view showing a base plate for a circuit board according to Embodiment 4 of the present invention.

FIG. 13 shows a sectional view of a base plate for a circuit board according to Embodiment 4. The base plate is obtained by joining an Al heat sink 12 formed of pure Al with the rear surface of the plate member 1 in the base plate of Embodiment 1 via an Al—Mg-based alloy layer 11.

Figure 14:
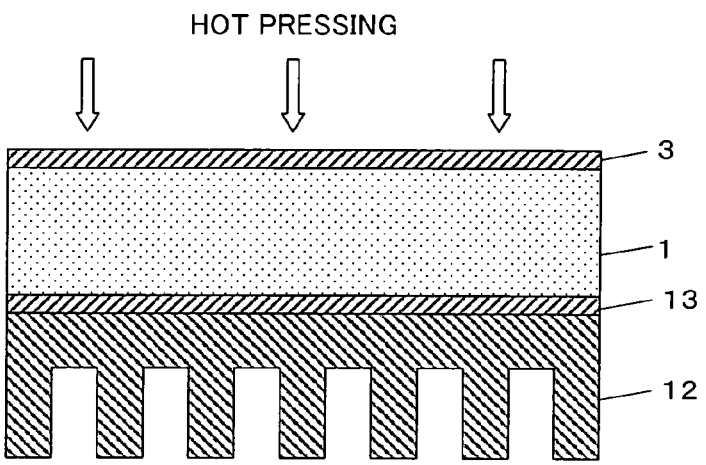
FIG. 14 is a sectional view showing how an Al foil member, an insert member, and an Al heat sink are joined with a plate member in Embodiment 4.

Such base plate can be produced by casting a plate member 1 made of an Al/SiC composite and then bringing an Al foil member 3 formed of, for example, an Al—Mg-based alloy into contact with the surface of the plate member 1 as shown in FIG. 14 and bringing the Al heat sink 12 formed of pure Al into contact with the rear surface of the plate member 1 via a foil-like insert member 13 formed of an Al—Mg-based alloy in the same manner as in the Al foil member 3 and further, joining through hot pressing the Al foil member 3 with the surface of the plate member 1 in this state and joining through hot pressing the Al heat sink 12 with the rear surface of the plate member 1 via the insert member 13 simultaneously with the joining of the Al foil member 3.

When one attempts to directly join the Al heat sink 12 made of pure Al with the plate member 1 made of an Al/SiC composite, it is difficult to achieve a state where the heat sink and the plate member are strongly joined with each other. In this embodiment, however, the insert member 13 made of an Al—Mg-based alloy is interposed between them. As a result, the Al—Mg-based alloy layer 11 is formed through hot pressing, so the plate member 1 and the Al heat sink 12 are joined with each other via the Al—Mg-based alloy layer 11. Thus, a base plate equipped with a heat sink can be formed.

The Al heat sink 12 formed of pure Al can be joined with the rear surface of the plate member 1 via an Al—Li-based or Al—Ti-based alloy layer instead of the Al—Mg-based alloy layer 11. In this case, it is sufficient that the rear surface of the plate member 1 and the Al heat sink 12 made of pure Al are joined with each other through hot pressing with a foil-like insert member formed of an Al—Li-based or Al—Ti-based alloy interposed between them.

Although the Al foil member 3 and the insert member 13 may have different compositions, both the Al foil member 3 and the insert member 13 are desirably joined simultaneously with the plate member 1 made of an Al/SiC composite and the insert member 13 and the Al heat sink 12 are desirably joined with each other at such junction temperature that may not damage the fin shape of the Al heat sink 12.

Figure 15:
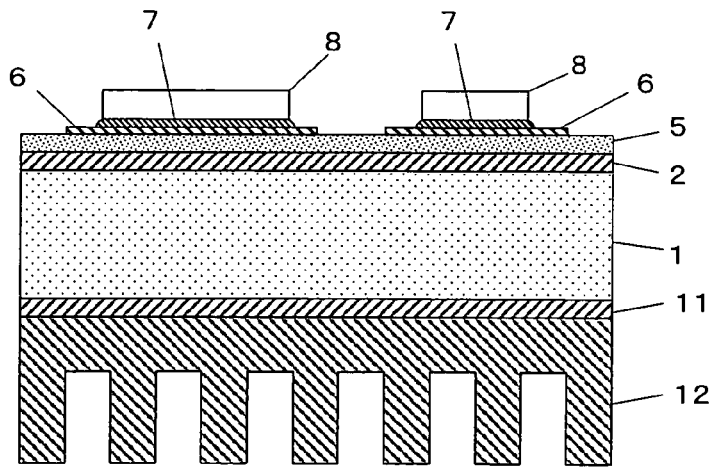
FIG. 15 is a sectional view showing a semiconductor device using the base plate for a circuit board according to Embodiment 4.

As shown in FIG. 15, an insulating layer 5 is formed on the surface of the Al—Mg-based alloy layer 2 of the base plate equipped with the heat sink thus produced. In addition, a wiring layer 6 made of Cu or the like is formed on the surface of the insulating layer 5, whereby a circuit board can be formed. Furthermore, a semiconductor element 8 is joined onto the wiring layer 6 via solder 7. Thus, a semiconductor device can be constituted.

Figure 16:
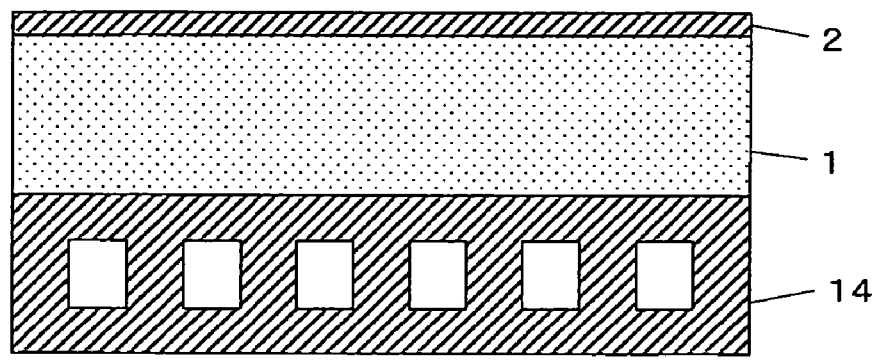
FIG. 16 is a sectional view showing a base plate for a circuit board according to a modified example of Embodiment 3.
Figure 17:
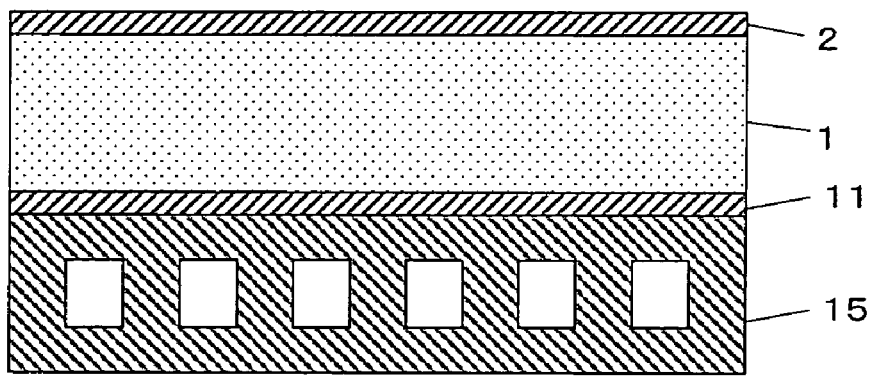
FIG. 17 is a sectional view showing a base plate for a circuit board according to a modified example of Embodiment 4.

Each of the Al heat sink 9 in Embodiment 3 and the Al heat sink 12 in Embodiment 4 is an air-cooled heat sink having a fin shape formed thereon. A water-cooled heat sink having a water pipe formed therein as shown in each of FIGS. 16 and 17 may also be used. FIG. 16 shows a base plate obtained by directly joining, with the rear surface of the plate member 1, a water-cooled Al heat sink 14 formed of one of an Al—Mg-based alloy, an Al—Li-based alloy, and an Al—Ti-based alloy. FIG. 17 shows a base plate obtained by joining a water-cooled Al heat sink 15 formed of pure Al with the rear surface of the plate member 1 via the Al—Mg-based alloy layer 11.

As described above, in Embodiments 1 to 3 described above, each of the Al foil member 3 and the Al heat sink 9 is formed of one of an Al—Mg-based alloy, an Al—Li-based alloy, and an Al—Ti-based alloy. However, containing Si or the like in the alloy forming the Al foil member 3 or the Al heat sink 9 reduces the melting point. Accordingly, the use of an Al—Si—Mg-based alloy, an Al—Si—Li-based alloy, or an Al—Si—Ti-based alloy allows joining to be performed at a low junction temperature. Therefore, the fin shape of the Al heat sink 12 will not be damaged if the insert member 13 in Embodiment 4 is formed of one of such Al—Si—Mg-based, Al—Si—Li-based, and Al—Si—Ti-based alloys to perform the joining of and is joined with the Al heat sink 12 made of pure Al at a low junction temperature.

In joining the Al heat sink 9 formed of one of an Al—Mg-based alloy, an Al—Li-based alloy, and an Al—Ti-based alloy in Embodiment 3, if an insert member formed of an Al—Si—Mg-based alloy, an Al—Si—Li-based alloy, or an Al—Si—Ti-based alloy and having a lower melting point than that of the Al heat sink 9 is interposed between the rear surface of the plate member 1 and the Al heat sink 9 to perform the joining, it will be possible to join the rear surface and the Al heat sink with each other at a low junction temperature, therefore the fin shape of the Al heat sink 9 will not be damaged.

Each of the Al heat sinks 9, 12, 14, and 15, and the Al heat sink member 10 can be joined through rolling, brazing, hot forging, or the like instead of hot pressing. To produce multiple base plates at the same time, the Al foil member 3, the plate member 1, one of the Al heat sinks 9, 12, 14, and 15 and the Al heat sink member 10, and, as required, the insert member each of which has a large size may be laminated on one another, and the respective laminated members may be joined with one another when each base plate is perforated in this state.

According to the present invention, casting blowholes on the surface of an Al/SiC composite can be easily sealed at low cost without reductions in thermal property values.

In addition, the Al/SiC composite and a heat sink can be joined with each other while an increase in thermal resistance is suppressed.

What is claimed is:

1. A circuit board, comprising:
   a plate member made of an Al/SiC composite formed by casting;
   an alloy layer formed on a front surface of the plate member;
   an electrical insulating layer formed on a surface of the alloy layer; and
   a wiring layer formed on a surface of the electrical insulating layer, the alloy layer being made of one of an Al—Mg-based alloy, an Al—Li-based alloy, and an Al—Ti-based alloy.

2. A circuit board according to claim 1, wherein the alloy layer has a higher melting point than a melting point of the Al/SiC composite forming the plate member.

3. A circuit board according to claim 1, wherein the alloy layer has a lower melting point than a melting point of the Al/SiC composite forming the plate member.

4. A circuit board according to claim 1, further comprising an Al heat sink formed on a rear surface of the plate member.

5. A circuit board according to claim 4, wherein the Al heat sink member is formed of one of an Al—Mg-based alloy, an Al—Li-based alloy, and an Al—Ti-based alloy.

6. A circuit board according to claim 4, further comprising an alloy layer arranged between the rear surface of the plate member and the Al heat sink and made of one of an Al—Mg-based alloy, an Al—Li-based alloy, and an Al—Ti-based alloy, the Al heat sink being formed of pure Al.

* * * * *